(12) United States Patent
Gao

(10) Patent No.: US 12,559,856 B2
(45) Date of Patent: Feb. 24, 2026

(54) SEMI-INSULATING GALLIUM ARSENIDE SINGLE CRYSTAL, PREPARATION METHOD AND GROWTH DEVICE THEREFOR

(71) Applicant: SHANXI CHINA CRYSTAL TECHNOLOGIES CO., LTD., Shanxi (CN)

(72) Inventor: Youjun Gao, Shanxi (CN)

(73) Assignee: SHANXI CHINA CRYSTAL TECHNOLOGIES CO., LTD., Shanxi (CN)

( * ) Notice: Subject to any disclaimer, the term of this patent is extended or adjusted under 35 U.S.C. 154(b) by 238 days.

(21) Appl. No.: 18/519,483

(22) Filed: Nov. 27, 2023

(65) Prior Publication Data

US 2024/0093402 A1 Mar. 21, 2024

Related U.S. Application Data

(63) Continuation of application No. PCT/CN2023/085640, filed on Mar. 31, 2023.

(30) Foreign Application Priority Data

May 19, 2022 (CN) ......................... 202210542555.3

(51) Int. Cl.
*C30B 15/02* (2006.01)
*C30B 15/10* (2006.01)
(Continued)

(52) U.S. Cl.
CPC .............. *C30B 15/02* (2013.01); *C30B 15/10* (2013.01); *C30B 15/206* (2013.01); *C30B 29/42* (2013.01)

(58) Field of Classification Search
CPC ..... C30B 11/002; C30B 11/006; C30B 15/02; C30B 15/10; C30B 15/206; C30B 29/42; Y02P 70/50
See application file for complete search history.

(56) References Cited

U.S. PATENT DOCUMENTS

2019/0352800 A1 11/2019 Ishikawa et al.

FOREIGN PATENT DOCUMENTS

CN       101603208 A  * 12/2009
CN       110512275 A    11/2019
(Continued)

OTHER PUBLICATIONS

International Search Report of corresponding PCT Application No. PCT/CN2023/085640; 4 Pgs. Jul. 1, 2023.
(Continued)

*Primary Examiner* — Hua Qi
(74) *Attorney, Agent, or Firm* — Cooper Legal Group, LLC

(57) ABSTRACT

A semi-insulating gallium arsenide single crystal preparation method includes: adding crystal material to a PBN crucible; adding graphite in a quartz cap; loading the hermetically connected quartz cap and quartz crucible into a VGF single crystal furnace in different temperature zones; controlling the temperature zone in which the quartz crucible is located at a temperature of material melting, while controlling the temperature zone is which the quartz cap is located at 1000±50° C.; preserving the temperature of material melting when the temperature zone in which the quartz crucible is located reaches the temperature of material melting, and controlling the temperature zone in which the quartz cap is located at 1200±50° C. and preserving the
(Continued)

temperature for 4 to 50 h; lowering a temperature in the temperature zone to 1000±50° C.; and cooling and discharging.

5 Claims, 3 Drawing Sheets

(51) Int. Cl.
    *C30B 15/20*     (2006.01)
    *C30B 29/42*     (2006.01)

(56)           References Cited

FOREIGN PATENT DOCUMENTS

| CN | 111406130 | A | 7/2020 |
| CN | 114635180 | A | 6/2022 |
| EP | 1288342 | A2 | 3/2003 |
| JP | H1087392 | A | 4/1998 |
| JP | H10167898 | A | 6/1998 |
| JP | H10259100 | A | 9/1998 |
| JP | H10338591 | A | 12/1998 |
| JP | H11147785 | A | 6/1999 |
| JP | 2005247626 | A | 9/2005 |
| JP | 2007106669 | A | 4/2007 |
| JP | 2008239480 | A | 10/2008 |
| JP | 2010059052 | A | 3/2010 |

OTHER PUBLICATIONS

First Office Action cited in corresponding German patent Application No. 10 2022 207 643.5, dated Jan. 22, 2024, 10 pages.
First Office Action received in corresponding Taiwanese patent application No. 112118701, dated Aug. 1, 2024, 18 pages.

* cited by examiner

SEMI-INSULATING GALLIUM ARSENIDE SINGLE CRYSTAL, PREPARATION METHOD AND GROWTH DEVICE THEREFOR

CROSS-REFERENCE TO RELATED APPLICATION

This application is a continuation of PCT application serial no. PCT/CN2023/085640, filed on Mar. 31, 2023, which claims the priority and benefit of Chinese patent application serial no. 202210542555.3, filed on May 19, 2022. The entirety of PCT application serial no. PCT/CN2023/085640 and Chinese patent application serial no. 202210542555.3 are hereby incorporated by reference herein and made a part of this specification.

TECHNICAL FIELD

The present application relates to the field of single crystal compounds, and in particular to a semi-insulating gallium arsenide single crystal and preparation method and growth device thereof.

BACKGROUND ART

Gallium arsenide (GaAs) material is the most important material in the second generations of new compound semiconductor following silicon single crystal. Gallium arsenide has excellent performance, such as high electron mobility and photoelectric conversion efficiency, and is used in the field of microelectronics and photoelectronics widely, playing an irreplaceable role especially in the commercialization of 5G.

Resistivity and mobility are main performance parameters for semi-insulating gallium arsenide (GaAs) crystals, and the carbon concentration in the crystal has an important effect on its resistivity and mobility. In conventional VGF method for growing semi-insulating gallium arsenide crystals, a reaction of high-purity graphite with oxygen released from quartz (which is produced by the decomposition of quartz and boron oxide) or high-purity graphite with water (trace water adsorbed by graphite or quartz) is mostly used to control the amount of carbon doping.

In the above VGF method, the release of oxygen from the graphite and the quartz at high temperature is relatively slow, resulting in extreme slow increase and diffusion of CO concentration in a surrounding atmosphere, and, in turn, gradient differences of carbon content inside the gallium arsenide crystals, so that there is an especially obvious longitudinal differences inside the crystals. Therefore, a final product thus obtained has a resistivity between $10^7$ and $10^8 \Omega \cdot cm$, and a poor consistency of electrical properties, imposing a significant limitation to the commercial use thereof.

SUMMARY

In order to improve homogeneity of carbon concentration in gallium arsenide crystals, and other properties such as resistivity and mobility, the present application provides a semi-insulating gallium arsenide single crystal, preparation method and growth device therefor.

In a first aspect, the present application provides a semi-insulating gallium arsenide single crystal, the semi-insulating gallium arsenide single crystal has a resistivity of $0.1 \times 10^8$ to $5 \times 10^8 \Omega \cdot cm$, a radial resistivity variation within the crystal is less than 8%, a Si concentration is $1.14 \times 10^{13}$ to $4.5 \times 10^{15}$ Atoms.cm$^{-3}$, and a C concentration is $6 \times 10^{15} - 2.0 \times 10^{16}$ Atoms·cm$^{-3}$.

The semi-insulating gallium arsenide single crystal has excellent electrical properties such as resistivity and mobility, as well as excellent homogeneity in electrical properties.

In a second aspect, the present application provides a preparation method of the semi-insulating gallium arsenide single crystal, which includes the follow steps: Step 1: adding a GaAs polycrystals, a crystal seed and boron oxide to a PBN crucible, and transferring the PBN crucible to a quartz crucible; adding graphite in a quartz cap, and connecting the quartz cap to the quartz crucible hermetically;

Step 2: loading the hermetically connected quartz cap and quartz crucible in Step 1 into a VGF single crystal furnace with the quartz cap and the quartz crucible in different temperature zones; Step 3: controlling the temperature zone in which the quartz crucible is located at a temperature of material melting, while controlling the temperature zone in which the quartz cap is located at $1000 \pm 50°$ C.;

Step 4: after the temperature zone in which the quartz crucible is located reaches the temperature of material melting, preserving the temperature for melting, controlling the temperature zone in which the quartz cap is located at $1200 \pm 50°$ C. and preserving the temperature for 4 to 50 h;

Step 5: after the material melting is completed, lowering a temperature in the temperature zone in which the quartz cap is located to $1000 \pm 50°$ C. and preserving the temperature to allow atmosphere doping and crystal growth;

Step 6: cooling and discharging.

The above technical solution provides a new method of controlling the amount of carbon doping by setting the quartz cap containing graphite and the quartz crucible in different temperature zones and lowering a temperature in the temperature zone in which the quartz cap is located to reach a suitable temperature to induce the following reaction happened between graphite and quartz:

$$SiO_2 + C \leftrightarrows CO + SiO;$$

The CO produced by the reaction provides the main source of carbon for atmosphere doping, thus achieving effective carbon doping of microwave crystals and controlling the carbon content in the atmosphere through the control of the chemical reaction process. By the way, the CO produced by the reaction of C with $H_2O$ or $O_2$ in the atmosphere also exists in small amounts.

In the control of the above reaction, when the temperature of the temperature zone in which the graphite is located $\leq 1000°$ C., the reaction of the C and the $SiO_2$ is basically not happened, i.e., in Step 3 and Step 5; the graphite is actually not reacted with the quartz to produce CO; while when the temperature of the temperature zone in which the graphite is located $\geq 1200°$ C., the reaction of the C and the $SiO_2$ is happened continuously, i.e., in Step 4; the CO is produced continuously. To ensure the stability of the CO content, reaction duration of the temperature $\geq 1200°$ C. should be controlled.

The main way for the C doping into the GaAs are:

$$2Ga + CO \leftrightarrows Ga_2O + C$$

Free Ga in the GaAs happens the above chemical reaction with the CO in the atmosphere, introducing the C into the GaAs.

In conventional VGF process, the carbon source for atmosphere doping is mainly obtained through the reaction of the graphite with the growth device or the water and the oxygen contained in the graphite itself, with the following reaction equations:

$$C+H_2O \rightarrow CO+H_2;$$

$$2C+O_2 \rightarrow 2CO;$$

$$C+O_2 \rightarrow CO_2;$$

The way for the C doping into the GaAs are:

$$2Ga+CO \rightarrow Ga_2O+C;$$

$$4Ga+CO_2 \rightarrow Ga_2O_3+3C;$$

However, in high temperature environment, the release of oxygen from the graphite and the growth device (quartz) is slower, and resulting in a small and uneven distribution of the carbon concentration in the crystal, a low crystal resistivity which has a large difference between each parts in the crystal, and poor application performance. In the present application, the reaction rate of the C and the $SiO_2$ can be controlled by temperature and contact area between the graphite and the quartz. Usually, the higher the temperature of the temperature zone in which the graphite is located, the more intense the reaction forward, the more the CO content in the atmosphere, and the more the carbon content in the crystal correspondingly. Meanwhile, the larger the contact area between the graphite and the quartz, the more the CO content in the atmosphere, and the more the carbon content in the crystal correspondingly. It makes the CO content in the atmosphere relatively easy to control and the C concentration in the crystal more homogeneous, which is conducive to improve the homogeneity of the resistivity and the mobility in the crystal.

Preferably, the graphite is pre-treated before placing in the quartz cap, and the pre-treating comprises removal of moisture.

In the above technical solutions, placing the graphite in a quartz container, sealing and evacuating, and then baking the quartz container to remove as much moisture as possible from the graphite, reducing the effect of the CO produced by the reaction of the C and the $H_2O$ on the CO concentration in the atmosphere, improving the accuracy of the carbon doping amount in the crystal, and guaranteeing that the crystal has a high resistivity and mobility. The present application has no special requirements for baking temperature, usually baking at $200\pm30°$ C. can take into account both the efficiency and the energy consumption.

Preferably, the PBN crucible, the quartz crucible, the quartz cap and the VGF single crystal furnace are subjected to the pre-treat before using.

In the above technical solutions, the PBN crucible, the quartz crucible and the quartz cap also need to be pre-treated before use to strictly control the moisture and the oxygen content of the materials and the equipment used for crystal growth and obtaining gallium arsenide crystals with high resistivity.

Preferably, the pre-treating comprises vacuuming, and the vacuuming is performed at an absolute vacuum degree of (1 to $9\times10^{-4}$) to (1 to $9\times10^{-2}$) Pa.

In the above technical solutions, at this vacuum degree, it may control the adequate discharge of water from the graphite raw material, reducing the side reactions between the graphite and the water, and ensuring the controllability of the CO content in the atmosphere. At the above vacuum degree, the moisture can be removed effectively with a general baking time about 2 to 4 h.

Preferably, the crystal growth is performed at a cooling rate of 0.1 to 10° C./h and a temperature gradient of 0.1 to 10° C./cm in Step 5.

In the above technical solutions, the growth of the semi-insulating gallium arsenide crystals is effectively guaranteed under the cooling rate and the temperature gradient.

In a third aspect, the present application provides a growth device of the semi-insulating gallium arsenide single crystal, including a VGF single crystal furnace, a quartz crucible located inside the VGF single crystal furnace, a PBN crucible provided inside the quartz crucible, the quartz crucible is provided with a quartz cap at an opening of the quartz crucible, and a receiving groove for receiving the graphite is defined inside the quartz cap; and a first temperature zone and a second temperature zone are defined in the VGF single crystal furnace along an axial direction of the VGF single crystal furnace, the quartz cap is located in the first temperature zone, and the quartz crucible is located in the second temperature zone.

In the above technical solutions, in the crystal growth process, since the temperature field required for crystal growth exists a great difference from the reaction temperature of the C and the $SiO_2$, in this present application, placing a quartz tube in which the graphite is placed and the quartz crucible in which the gallium arsenide and other raw materials are placed in different temperature zones of the VGF single crystal furnace, and using different heating sources to control the required temperature for each temperature zone.

Preferably, an end of the quartz cap near the quartz crucible is provided a transition tube, and the transition tube communicates with the receiving groove.

In the above technical solutions, since the reaction temperature of the graphite exists a great difference from the growth temperature in the quartz crucible, to reduce the temperature interference between the two temperature zones, thus the transition tube is provided between the receiving groove and the quartz crucible to guarantee the reaction between the graphite and the quartz, and to be conducive to control the CO content in the atmosphere precisely.

Preferably, the diameter of the transition tube is smaller than a width of the receiving groove.

In the above technical solutions, the transition tube has a small diameter and an overall slender shape, which is conducive to reduce the heat convection between the receiving groove and the quartz crucible and improve the control accuracy of the reaction temperature at the receiving groove.

Preferably, the first temperature zone includes a plurality of temperature zones arranged along the axial direction of the VGF single crystal furnace, and the second temperature zone includes a plurality of temperature zones arranged along the axial direction of the VGF single crystal furnace.

In the above technical solutions, in the improved VGF process of the present application, the growth of gallium arsenide crystals needs to have a suitable temperature gradient, so that the first temperature zone needs to be divided into several independent small temperature zones in the axial direction to form a suitable temperature field to ensure the growth of crystals; while the reaction between the graphite and the $SiO_2$ needs to differ from the temperature field from the first temperature zone, and the second temperature zone is also divided into several small temperature zones to ensure the precise control of the reaction temperature.

It should be noted that in order to achieve the effective control of temperature, the distance between the temperature zones is generally controlled from 8 cm to 25 cm. The present application preferably divides the first temperature zone into six small temperature zones, recorded as Tz1 to Tz6, and the second temperature zone into three small temperature zones, recorded as Tz7 to Tz9.

In summary, the present application has the following beneficial effects:

1. In the present application, controlling the reaction of the C in the graphite with the $SiO_2$ in the quartz cap to produce the CO, which can provide the main carbon source of the atmosphere doping for the growth of gallium arsenide crystals, and achieve the effective control of the CO content in the atmosphere to guarantee the homogeneity of carbon doping inside the crystal, so that the gallium arsenide single crystals with higher resistivity can be obtained.

2. In the present application, pre-treating the graphite and the growth device to reduce its water content sufficiently, so that it can reduce the effect of the CO generated by the reaction between the graphite and the water on the carbon concentration of the crystal and guarantee the high resistivity of the crystal.

3. In the present application, setting Tz7 to Tz9 corresponding to the quartz cap, so that it can guarantee the precise control of the reaction process between the C and the $SiO_2$ in the quartz cap effectively, ensure the homogeneity of the carbon concentration in the crystal, and guarantee the uniformity of its internal properties such as resistivity and mobility.

DETAILED DESCRIPTION

Preparation Examples

In Preparation example 1, a graphite column was obtained by pre-treatment, which particularly included placing the graphite column into a quartz tube, placing the quartz tube into an oven, connecting to a vacuum device hermetically, then evacuating the quartz tube to a vacuum degree of $9\times10^{-4}$ Pa, placing the quartz tube in the oven, and baking at 200° C. for 4 h to obtain the graphite column.

In Preparation example 2, a graphite column was obtained by pre-treatment, which particularly included placing the graphite column into a quartz tube, placing the quartz tube in an oven, connecting to a vacuum device hermetically, then evacuating the quartz tube to a vacuum degree of $1\times10^{-2}$ Pa, placing the quartz tube in the oven, and baking at 220° C. for 2 h to obtain the graphite column.

In Preparation example 3, a graphite column differs from that obtained in Preparation example 1 in that the graphite column was not pre-treated.

EXAMPLES

Example 1

Figure 1:
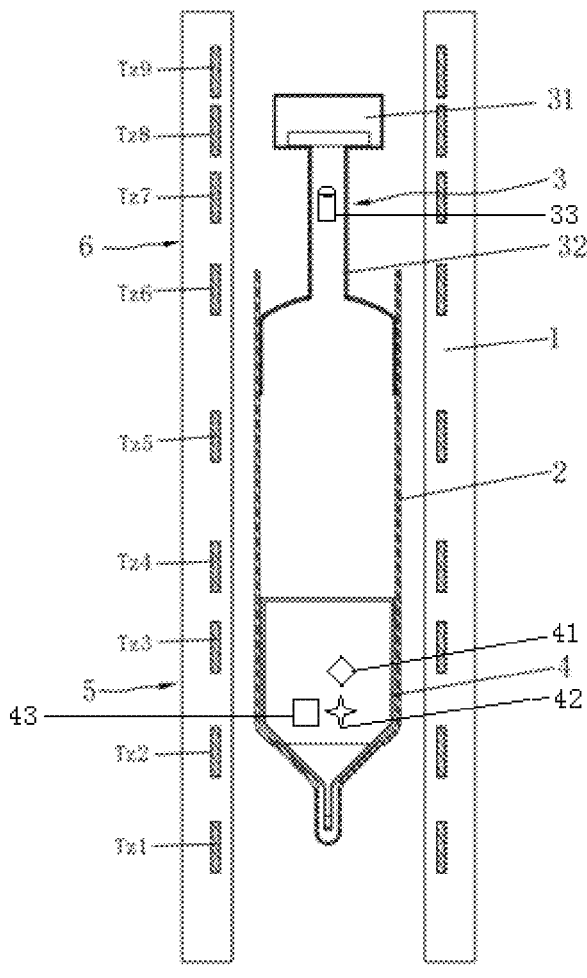
FIG. 1 is a schematic structural diagram of a growth device in Example 1 of the present application.

The present application provided a preparation method of semi-insulating gallium arsenide single crystal, in which the preparation process adopted a growth device of semi-insulating gallium arsenide single crystal for VGF method to grow crystal. Referring to FIG. 1, the growth device includes a VGF single crystal furnace 1, the VGF single crystal furnace 1 is loaded with a quartz crucible 2, the quartz crucible 2 is loaded with a PBN crucible 4, and an opening of the quartz crucible 2 is capped with a quartz cap 3. A main body of the quartz cap 3 includes a receiving groove 31, and a bottom of the quartz cap 3 is provided with a transition tube 32 which communicates with the receiving groove 31, and a diameter of the transition tube 32 is smaller than a width of the receiving groove 31.

The VGF single crystal furnace 1 includes a first temperature zone 5 and a second temperature zone 6, the first temperature zone 5 corresponds to the quartz crucible 2, and the second temperature zone 6 corresponds to the quartz cap 3. Further, the first temperature zone 5 includes Tz1 to Tz6, and the second temperature zone 6 includes Tz7 to Tz9 arranged along an axial direction of the VGF single crystal furnace 1 from bottom to top, and a temperature of each of the temperature zones is controlled independently.

The preparation method included the following steps:

Step 1: adding 10 kg of 7N GaAs polycrystals, 30 g of crystal seeds and boron oxide into a 4-inch PBN crucible 4, and transferring the PBN crucible 4 to a quartz crucible 2 to finish loading; then adding the graphite column (prepared in Preparation example 1) with 50 mm diameter and 20 mm thickness (length) to a receiving groove 31 inside the quartz cap 3 in such a way that a round bottom surface of the graphite column contacts the receiving groove 31, and then connecting (welding) the quartz cap 3 to the quartz crucible 2 hermetically.

Step 2: loading the quartz cap 3 and the quartz crucible 2 connected hermetically in Step 1 into the VGF single crystal furnace 1, so that the quartz cap 3 was located in the Tz7 to the Tz9 of the VGF single crystal furnace 1, and the quartz crucible 2 was located in the Tz1 to the Tz6 of the VGF single crystal furnace 1.

Step 3: raising a temperature in the Tz1 to the Tz6 to 1238° C. (a temperature of material melting), while raising a temperature in the Tz7 to the Tz9 to 1000±50° C.

Step 4: after the Tz1 to the Tz6 reached 1238° C. (the temperature of material melting), preserving the temperature for 6 to 12 h for melting; while raising a temperature in the Tz7 to the Tz9 to 1200±50° C. within 30 min and preserving the temperature for 10 h.

Step 5: after the GaAs polycrystals were melted, performing crystal growth by using VGF method, in which a cooling rate of the Tz1 to the Tz6 was 2 to 6° C./h and a temperature gradient was 0.1 to 5° C./cm; meanwhile, cooling the Tz7 to the Tz9 down to 1000±50° C. within 1 h and preserving the temperature to ensure a reaction occurring between the graphite and the quartz and formation of a CO atmosphere with stable content.

Step 6: cooling and discharging, during which, when the temperature in the Tz1 to the Tz6 was in the range of 1200 to 1238° C., the cooling rate was 2±1° C./h; when the temperature in the Tz1 to the Tz6 was in the range of 1000 to 1200° C., the cooling rate was 5 to 15° C./h; when the temperature in the Tz1 to the Tz6 was in the range of 50 to 1000° C., the cooling rate was 30±10° C./h; and cooling down the Tz7 to the Tz9 gradually to the temperature of discharging to obtain the final semi-insulating gallium arsenide crystal with a length of 200 mm.

The resistivity and mobility of the above-prepared crystals were tested according to the test methods specified in SJ/T 11488$^{-2015}$, and the test results were as follow:

| Test position | | | Test project | |
| | Sampling position | Resistivity/ $\Omega \cdot cm$ | Deviation from resistance mean value | Mobility $(cm^2/v \cdot s)$ |
| --- | --- | --- | --- | --- |
| Head piece | A | 1.37E+08 | 2.49% | 5656 |
| | B | 1.38E+08 | 3.24% | 5602 |
| | C | 1.26E+08 | −5.74% | 5637 |
| Tail piece | A | 1.38E+08 | 0.73% | 5265 |
| | B | 1.34E+08 | −2.19% | 5282 |
| | C | 1.39E+08 | 1.46% | 5232 |

A radial resistivity variation rate within the crystal (Deviation from resistance mean value)=(a resistance value of a test point/a mean value of test piece)×100% A ratio of head-to-tail resistance within the crystal: a mean value of the head piece/a mean value of the tail piece=0.97.

Figure 3:
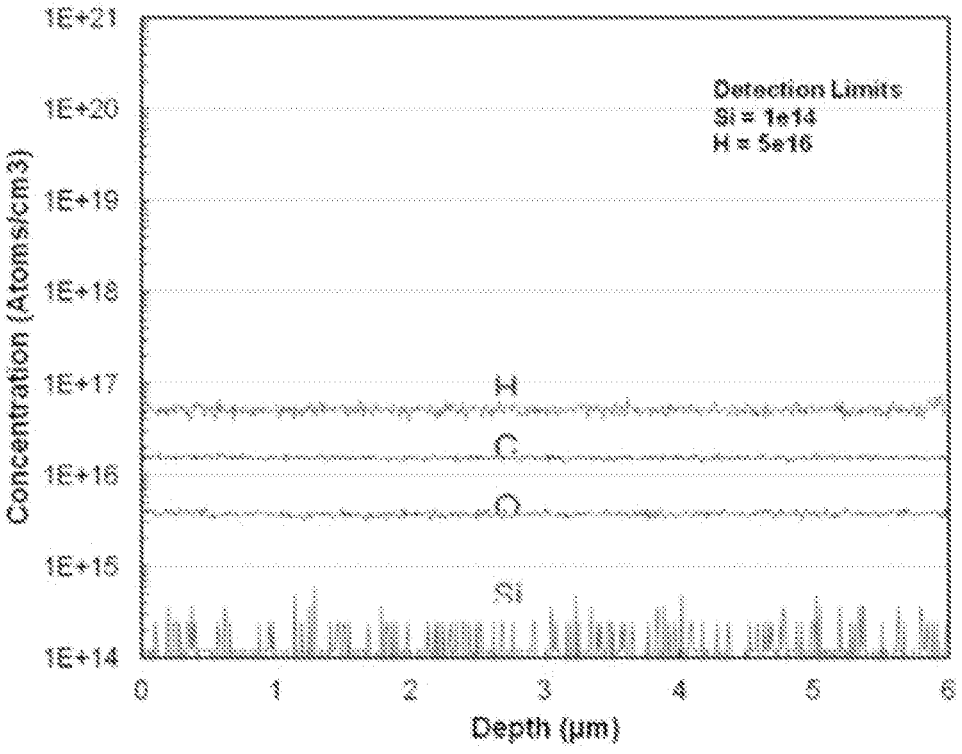
FIG. 3 is an element content test results graph of semi-insulating gallium arsenide crystal of Example 1 of the present application.

The test results of the elemental content were shown in FIG. 3.

Referring to FIG. 3, it can be seen that the content of Si lies between $1.14*10^{13}$ and $4.5*10^{15}$ Atoms·cm$^{-3}$, and the content of C lies between $6*10^{15}$ and $2.0*10^{16}$ Atoms·cm$^{-3}$.

Example 2

Figure 2:
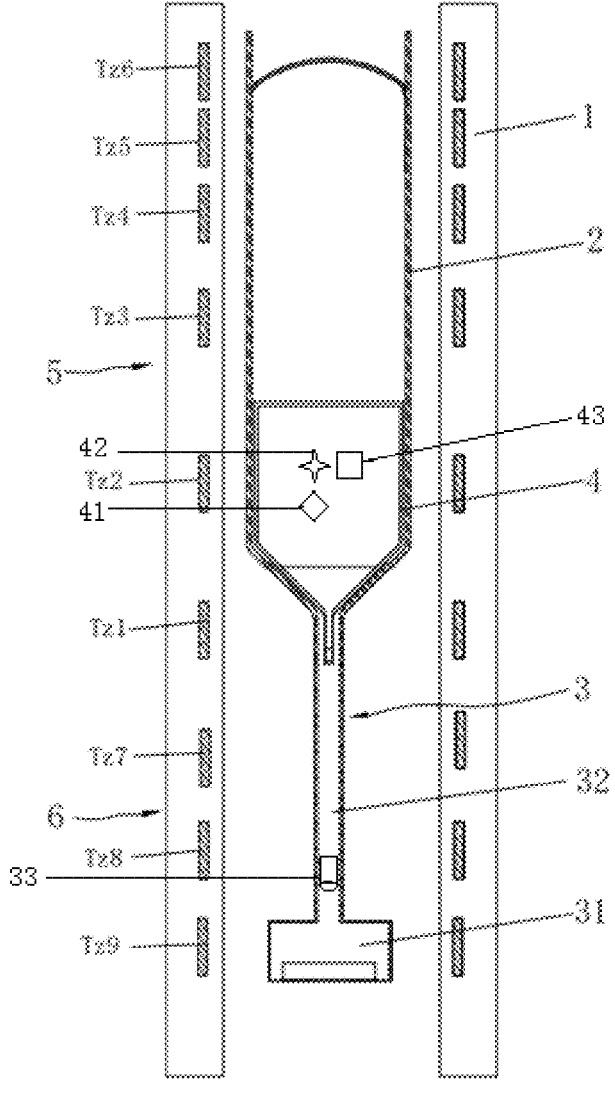
FIG. 2 is a schematic structural diagram of a growth device in Example 2 of the present application.

The present application provided a preparation method of semi-insulating gallium arsenide single crystal, in which the preparation process adopted a growth device of semi-insulating gallium arsenide single crystal for VGF method to grow crystal. Referring to FIG. 2, the growth device includes a VGF single crystal furnace 1, the VGF single crystal furnace 1 is loaded with a quartz crucible 2, the quartz crucible 2 is loaded with a PBN crucible 4, and an opening of the quartz crucible 2 is capped with a quartz cap 3. A main body of the quartz cap 3 includes a receiving groove 31, and a bottom of the quartz cap 3 is provided with a transition tube 32 which communicates with the receiving groove 31, and a diameter of the transition tube 32 is smaller than a width of the receiving groove 31.

The VGF single crystal furnace 1 includes a first temperature zone 5 and a second temperature zone 6, the first temperature zone 5 corresponds to the quartz crucible 2, and the second temperature zone 6 corresponds to the quartz cap 3. Further, the first temperature zone 5 includes Tz1 to Tz6, and the second temperature zone 6 includes Tz7 to Tz9, arranged along an axial direction of the VGF single crystal furnace 1 from bottom to top, and a temperature of each of the temperature zones is controlled independently.

The preparation method included the following steps:

Step 1: adding 24 kg of 7N GaAs polycrystals, 65 g of crystal seeds and boron oxide into a 6-inch PBN crucible 4, and transferring the PBN crucible 4 to the quartz crucible 2 to finish loading; then adding the graphite column (prepared in Preparation example 2) with 60 mm diameter and 20 mm thickness into a receiving groove 31 inside the quartz cap 3 in such a way that a round bottom surface of the graphite column contacts the receiving groove 31, and then connecting the quartz cap 3 to the quartz crucible 2 hermetically.

Step 2: loading the quartz cap 3 and the quartz crucible 2 connected hermetically in Step 1 into the VGF single crystal furnace 1, so that the quartz cap 3 was located in the Tz7 to the Tz9 of the VGF single crystal furnace 1, and the quartz crucible 2 was located in the Tz1 to the Tz6 of the VGF single crystal furnace 1.

Step 3: raising a temperature in the Tz1 to the Tz6 to 1238° C. (a temperature of material melting), while raising a temperature in the Tz7 to the Tz9 to 1000±50° C.

Step 4: after the Tz1 to the Tz6 reached 1238° C. (the temperature of material melting), preserving the temperature for 6 to 10 h for melting; while raising a temperature in the Tz7 to the Tz9 to 1200±50° C. within 30 min and preserving the temperature for 50 h.

Step 5: after the GaAs polycrystals were melted, performing crystal growth by using VGF method, in which a cooling rate of the Tz1 to the Tz6 was 5 to 10° C./h and a temperature gradient was 3 to 8° C./cm; meanwhile, cooling the Tz7 to the Tz9 down to 1000±50° C. within 1 h and preserving the temperature to ensure a reaction occurring between the graphite and the quartz and formation of a CO atmosphere with stable content.

Step 6, cooling and discharging, during which, when the temperature in the Tz1 to the Tz6 was in the range of 1200 to 1238° C., the cooling rate was 2±1° C./h; when the temperature in the Tz1 to the Tz6 was in the range of 1000 to 1200° C., the cooling rate was 5 to 15° C./h; when the temperature in the Tz1 to the Tz6 was in the range of 50 to 1000° C., the cooling rate was 30±10° C./h; and cooling down the Tz7 to the Tz9 gradually to the temperature of discharging to obtain a final semi-insulating gallium arsenide crystal with a length of 200 mm.

The resistivity and mobility of the above-prepared crystals were tested according to the test methods specified in SJ/T 11488$^{-2015}$, and the test results were as follows:

| Test position | | | Test project | |
| | Sampling position | Resistivity/ $\Omega \cdot cm$ | Deviation from resistance mean value | Mobility $(cm^2/v \cdot s)$ |
| --- | --- | --- | --- | --- |
| Head piece | A | 3.00E+08 | −0.66% | 5176 |
| | B | 2.94E+08 | −2.65% | 5256 |
| | C | 3.03E+08 | 0.33% | 5164 |
| | D | 2.94E+08 | −2.65% | 5183 |
| | E | 3.19E+08 | 5.63% | 5085 |
| Tail piece | A | 3.48E+08 | −1.75% | 5021 |
| | B | 3.75E+08 | 5.87% | 4914 |
| | C | 3.40E+08 | −4.01% | 4935 |
| | D | 3.51E+08 | −0.90% | 5048 |
| | E | 3.57E+08 | 0.79% | 5075 |

A radial resistivity variation rate within the crystal=(a resistance value of a test point/a mean value of test piece)× 100%

A ratio of head-to-tail resistance within the crystal: a mean value of the head piece/a mean value of the tail piece=0.72.

Figure 4:
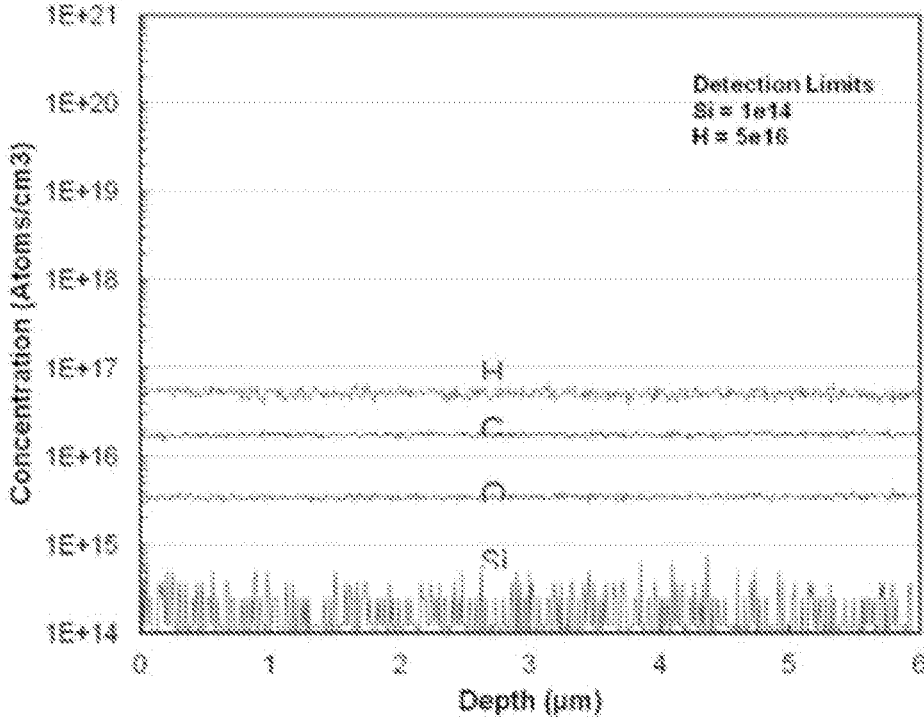
FIG. 4 is an element content test results graph of semi-insulating gallium arsenide crystal of Example 2 of the present application.

The test results of the elemental content were shown in FIG. 4.

Referring to FIG. 4, it can be seen that the content of Si lies between $1.14*10^{13}$ and $4.5*10^{15}$ Atoms·cm$^{-3}$, and the content of C lies between $6*10^{15}$ and $2.0*10^{16}$ Atoms·cm$^{-3}$.

Example 3

The present application provided a preparation method of semi-insulating gallium arsenide single crystal, which differs from Example 1 in that the preparation steps included:

Step 1: adding 10 kg of 7N GaAs polycrystals, 30 g of crystal seeds and boron oxide into a 4-inch PBN crucible 4, and transferring the PBN crucible 4 to a quartz crucible 2 to finish loading; then adding the graphite column (prepared in Preparation example 1) with 50 mm diameter and 20 mm thickness into a receiving groove 31 inside the quartz cap 3 in such a way that a round bottom surface of the graphite column contacts the receiving groove 31, and then connecting the quartz cap 3 to the quartz crucible 2 hermetically.

Step 2: loading the quartz cap 3 and the quartz crucible 2 connected hermetically in Step 1 into the VGF single crystal furnace 1, so that the quartz cap 3 was located in the Tz7 to the Tz9 of the VGF single crystal furnace 1, and the quartz crucible 2 was located in the Tz1 to the Tz6 of the VGF single crystal furnace 1.

Step 3: raising a temperature in the Tz1 to the Tz6 to 1238° C. (the temperature of material melting), while raising a temperature in the Tz7 to the Tz9 to 1000±50° C.

Step 4: after the Tz1 to the Tz6 reached 1238° C. (the temperature of material melting), preserving the temperature for 6 to 12 h for melting; while raising a temperature in the Tz7 to the Tz9 to 1200±50° C. within 30 min and preserving the temperature for 4 h.

Step 5: after the GaAs polycrystals were melted, performing crystal growth by using to VGF method, in which a cooling rate of the Tz1 to the Tz6 was 0.1 to 5° C./h and a temperature gradient was 2 to 7° C./cm; meanwhile, cooling the Tz7 to the Tz9 down to 1000±50° C. within 1 h and preserving the temperature to ensure a reaction occurring between the graphite and the quartz and formation of the CO atmosphere with stable content.

Step 6: cooling and discharging, during which, when the Tz1 to the Tz6 in the range of 1200 to 1238° C., the cooling rate was 2±1° C./h; when the Tz1 to the Tz6 was in the range of 1000 to 1200° C., the cooling rate was 5 to 15° C./h; when the Tz1 to the Tz6 was in the range of 50 to 1000° C., the cooling rate was 30±10° C./h; and cooling the Tz7 to the Tz9 down gradually to the temperature of discharging to obtain a final semi-insulating gallium arsenide crystal with a length of 200 mm.

The resistivity and mobility of the above-prepared crystals were tested according to the test methods specified in SJ/T 11488$^{-2015}$, and the test results were as follows:

| Test position | | Test project | | |
| | Sampling position | Resistivity/ $\Omega \cdot$ cm | Deviation from resistance mean value | Mobility $(cm^2/v \cdot s)$ |
| --- | --- | --- | --- | --- |
| Head piece | A | 2.05E+08 | −0.65% | 5528 |
| | B | 2.09E+08 | 1.29% | 5739 |
| | C | 2.05E+08 | −0.65% | 5779 |
| Tail piece | A | 3.26E+08 | 1.98% | 5043 |
| | B | 3.19E+08 | −0.21% | 5192 |
| | C | 3.14E+08 | −1.77% | 5156 |

A ratio of head-to-tail resistance within the crystal: a mean value of the head piece/a mean value of the tail piece=0.65.

Example 4

The present application provided a preparation method of semi-insulating gallium arsenide single crystal, which differs from Example 1 in that in Step 1; the graphite column was the one prepared in Preparation example 3.

The resistivity and mobility of the above-prepared crystals were tested according to the test methods specified in SJ/T 11488$^{-2015}$, and the test results showed that, absence of moisture removing of the graphite led to poor consistency of parameters in a same batch of crystals, and the resistivity of the crystals obtained under the same process environment might be $1\times10^8\Omega\cdot$cm or $5\times10^8\Psi\cdot$cm, or even could not be measured due to inappropriate parameters in the crystals; and from the perspective view of a single crystal, there are some normal crystals with relatively consistent parameters.

Example 5

The present application provided a preparation method of semi-insulating gallium arsenide single crystal, which differs from Example 1 in that the preparation steps included:

Step 1: adding 10 kg of 7N GaAs polycrystals, 30 g of crystal seeds and boron oxide into the 4-inch PBN crucible 4, transferring the PBN crucible 4 to the quartz crucible 2 to finish loading; then adding the graphite column (prepared in Preparation example 1) with 30 mm diameter and 20 mm thickness into the receiving groove 31 inside the quartz cap 3 in such a way that a round bottom surface of the graphite column contacts the receiving groove 31, then connecting the quartz cap 3 to the quartz crucible 2 hermetically.

Step 2: loading the quartz cap 3 and the quartz crucible 2 connected hermetically in Step 1 into the VGF single crystal furnace 1, and the quartz cap 3 was located in the Tz7 to the Tz9 of the VGF single crystal furnace 1, and the quartz crucible 2 was located in the Tz1 to the Tz6 of the VGF single crystal furnace 1.

Step 3: raising a temperature in the Tz1 to the Tz6 to 1238° C. (the temperature of material melting), while raising a temperature in the Tz7 to the Tz9 to 1000±50° C.

Step 4: after the Tz1 to the Tz6 reached 1238° C. (the temperature of material melting), preserving the temperature for 6 to 12 h for melting; while raising a temperature in the Tz7 to the Tz9 to 1200±50° C. within 30 min and preserving the temperature for 6 h.

Step 5: after the GaAs polycrystals were melted, performing crystal growth by using VGF method, in which a cooling rate of the Tz1 to the Tz6 was 2 to 6° C./h and a temperature gradient was 0.1 to 5° C./cm; meanwhile, cooling the Tz7 to the Tz9 down to 1000±50° C. within 1 h and preserving the temperature to ensure a reaction occurring between the graphite and the quartz and the formation of a CO atmosphere with stable content.

Step 6: cooling and discharging, during which, when the Tz1 to the Tz6 was in the range of 1200 to 1238° C., the cooling rate was 1 to 3° C./h; when the Tz1 to the Tz6 was in the range of 1000 to 1200° C., the cooling rate was 5 to 15° C./h; when the Tz1 to the Tz6 was in the range of 50 to 1000° C., the cooling rate was 20 to 40° C./h; and cooling the Tz7 to the Tz9 down gradually to the temperature of discharging to obtain a final semi-insulating gallium arsenide crystal with the length of 200 mm.

The resistivity and mobility of the above-prepared crystals were tested according to the test methods specified in SJ/T 11488$^{-2015}$, and the test results were as follows:

| Test position | | Test project | | |
| | Sampling position | Resistivity/ $\Omega \cdot$ cm | Deviation from resistance mean value | Mobility $(cm^2/v \cdot s)$ |
| --- | --- | --- | --- | --- |
| Head piece | A | 4.43E+07 | −3.06% | 6101 |
| | B | 4.55E+07 | −0.44% | 6120 |
| | C | 4.73E+07 | 3.50% | 6139 |

-continued

| Test position | Sampling position | Resistivity/ Ω · cm | Deviation from resistance mean value | Mobility (cm²/v · s ) |
|---|---|---|---|---|
| Tail piece | A | 5.77E+07 | 3.84% | 6167 |
| | B | 6.44E+07 | −2.10% | 6122 |
| | C | 5.46E+07 | −1.74% | 6024 |

A ratio of head-to-tail resistance within the crystal: a mean value of the head piece/a mean value of the tail piece=0.78.

COMPARATIVE EXAMPLE

Comparative Example 1

The present application provided a preparation method of semi-insulating gallium arsenide single crystal, in which the preparation process adopted a growth device of semi-insulating gallium arsenide single crystal for VGF method to grow crystal. The growth device includes a VGF single crystal furnace 1, the VGF single crystal furnace 1 is loaded with a quartz crucible 2 and a quartz cap 3 which is capped with the quartz crucible 2, wherein a receiving groove 31 is set inside the quartz cap 3, and the height of the receiving groove 31 is smaller than the depth of the quartz cap 3, and the quartz crucible 2 is loaded with a PBN crucible 4.

The VGF single crystal furnace 1 is provided with Tz1 to Tz6 along the axial direction of the VGF single crystal furnace 1, in which each of the temperature zones is equipped with an independent heating source, and the quartz crucible 2 and the quartz cap 3 are located in the range of the Tz1 to the Tz6.

The preparation method included the following steps:

Step 1: adding 10 kg of 7N GaAs polycrystals, 30 g of crystal seeds and boron oxide into the 4-inch PBN crucible 4, and transferring the PBN crucible 4 to the quartz crucible 2 to finish loading; then adding the graphite column with 50 mm diameter and 20 mm thickness into a receiving groove 31 inside the quartz cap 3, then connecting the quartz cap 3 to the quartz crucible 2 hermetically.

Step 2: loading the quartz cap 3 and the quartz crucible 2 connected hermetically in Step 1 into the VGF single crystal furnace 1.

Step 3: raising a temperature in the Tz1 to the Tz6 to 1238° C. (the temperature of material melting).

Step 4: after the Tz1 to the Tz6 reached 1238° C. (the temperature of material melting), preserving the temperature for 6 to 10 h for melting.

Step 5: after the GaAs polycrystals were melted, performing crystal growth by using to VGF method, in which a cooling rate of the Tz1 to the Tz6 was 1 to 5° C./h and a temperature gradient was 2 to 6° C./cm Step 6: cooling and discharging, during which, when the Tz1 to the Tz6 was in the range of 1200 to 1238° C., the cooling rate was 2±1° C./h; when the Tz1 to the Tz6 was in the range of 1000 to 1200° C., the cooling rate was 5 to 15° C./h; when the Tz1 to the Tz6 was in the range of 50 to 1000° C., the cooling rate was 30±10° C./h to obtain a final semi-insulating gallium arsenide crystal with a length of 200 mm.

The resistivity and mobility of the above-prepared crystals were tested according to the test methods specified in SJ/T 11488[−2015], and the test results were as follow:

| Test position | Sampling position | Resistivity/ Ω · cm | Deviation from resistance mean value | Mobility (cm²/v · s ) |
|---|---|---|---|---|
| Head piece | A | 7.73E+07 | 11.01% | 5700 |
| | B | 6.83E+07 | −1.91% | 5823 |
| | C | 6.33E+07 | −9.10% | 5738 |
| At 60 mm | A | 4.74E+08 | −6.94% | 4306 |
| | B | 5.08E+08 | −0.26% | 4102 |
| | C | 5.46E+08 | 7.20% | 4234 |
| Tail piece | A | 105 | no | 105 |
| | B | 105 | no | 105 |
| | C | 105 | no | 105 |

From the above table, it can be seen that the data at the tail piece of the crystal was of a reverse type, that is, a P-type semiconductor crystal, so that a high Hall resistance could not be measured, showing as 105.

Comparative Example 2

The present application provided a preparation method of semi-insulating gallium arsenide single crystal, which differs from Comparative example 1 by using the growth device of semi-insulating gallium arsenide single crystal in Example 1 to grow crystal, and controlling the temperature of the Tz7 to Tz9 in the range of 1200±50° C. at all times.

The preparation method includes the following steps:

Step 1: adding 10 kg of 7N GaAs polycrystals, 30 g of crystal seeds and boron oxide into the 4-inch PBN crucible 4, and transferring the PBN crucible 4 to the quartz crucible 2 to finish loading; then adding the graphite column (prepared in Preparation example 1) with 50 mm diameter and 20 mm thickness into the receiving groove 31 inside the quartz cap 3, then connecting the quartz cap 3 to the quartz crucible 2 hermetically.

Step 2: loading the quartz cap 3 and the quartz crucible 2 connected hermetically in Step 1 into the VGF single crystal furnace 1, so that the quartz cap 3 was located in the Tz7 to the Tz9 of the VGF single crystal furnace 1, and the quartz crucible 2 was located in the Tz1 to the Tz6 of the VGF single crystal furnace 1.

Step 3: raising the temperature in the Tz1 to the Tz6 to 1238° C. (the temperature of material melting), while raising the temperature in the Tz7 to the Tz9 to 1200±50° C. and then preserving the temperature.

Step 4: after the Tz1 to the Tz6 reached 1238° C. (the temperature of material melting), preserving the temperature for 8 h for melting, while controlling the temperature in the Tz7 to the Tz9 at 1200±50° C.

Step 5: after the GaAs polycrystals were melted, performing crystal growth by using VGF method, in which a cooling rate of the Tz1 to the Tz6 was 2 to 6° C./h and a temperature gradient was 0.1 to 5° C./cm; meanwhile, controlling a temperature in the Tz7 to the Tz9 at 1200±50° C. to ensure a reaction occurring between the graphite and the quartz and formation of the CO atmosphere with stable content.

Step 6: cooling and discharging, during which, when the Tz1 to the Tz6 in the range of 1200 to 1238° C., the cooling rate was 2±1° C./h; when the Tz1 to the Tz6 in the range of 1000 to 1200° C., the cooling rate was 5 to 15° C./h; when the Tz1 to the Tz6 in the range of 50 to 1000° C., the cooling rate was 30±10° C./h; and cooling the Tz7 to the Tz9 down gradually to the temperature of discharging to obtain a final semi-insulating gallium arsenide crystal with a length was 200 mm.

The resistivity and mobility of the above-prepared crystals were tested according to the test methods specified in SJ/T 11488$^{-2015}$, and the test results were as follows:

| | | Test project | | |
|---|---|---|---|---|
| Test position | Sampling position | Resistivity/ $\Omega \cdot cm$ | Deviation from resistance mean value | Mobility $(cm^2/v \cdot s)$ |
| Head piece | A | 1.27E+08 | 7.63% | 5935 |
| | B | 1.05E+08 | −11.02% | 5812 |
| | C | 1.22E+08 | 3.39% | 5650 |
| At 40 mm | A | 6.91E+08 | 9.39% | 2013 |
| | B | 5.50E+08 | −12.93% | 2013 |
| | C | 6.54E+08 | 3.54% | 1929 |
| Tail piece | A | 105 | no | 105 |
| | B | 105 | no | 105 |
| | C | 105 | no | 105 |

From the above table, it can be seen that the data at the tail piece of the crystal was of an inverse type, that is, P-type semiconductor crystal, and high Hall resistance could not be measured, showing as 105.

Analysis of the Test Results

From Examples 1 to 5 in comparison with Comparative example 1 to 2, it can be seen that in Examples 1 to 5, the graphite and the quartz crucible for gallium arsenide crystal growth are located in different temperature zones, and the temperature in the temperature zone in which the graphite is located is controlled to reach a suitable reaction temperature, so as to achieve the carbon doping of semi-insulating gallium arsenide; In contrast, in Comparative example 1, the conventional VGF method is used for the growth of semi-insulating gallium arsenide. The experimental results show that the resistivity distribution of the crystals obtained from Example 1 to 5 is significantly more homogeneous and the ratio of head-to-tail resistance within the crystal is smaller compared with Comparative example 1.

The reason may be that in the present application, the CO content in the atmosphere is controlled by the reaction: $SiO_2+C+CO+SiO$, in which the higher the reaction temperature is, the more the reaction moves right; the longer the reaction time is, the higher the CO content in the atmosphere is; and the larger the contact area between the graphite (C) and the quartz tube ($SiO_2$) is, the higher the CO content is. This reaction process is easy to control and can produce the CO gas in the growth device relatively quickly, providing relatively homogeneous CO content at all positions in the growth device, and thus guaranteeing the homogeneity of the carbon doping in gallium arsenide crystals. In contrast, in Comparative example 1, the CO content in the atmosphere is mainly controlled by the reaction between the graphite and oxygen released in the quartz cap (produced by the quartz cap and the boron oxide) or the graphite and water (produced by the graphite or the quartz cap). Due to a slow release rate of oxygen in high temperature environment, the increase and diffusion of the CO content in the atmosphere is extremely slow, so that the grown gallium arsenide crystals as produced have poor homogeneity in the internal carbon content and inferior electrical properties.

In Comparative example 2, since the Tz7 to the Tz9 are always at the high temperature of 1200±50° C., and the graphite is kept in contact with the quartz, the reaction: $SiO_2+C \leftrightarrows CO+SiO$ keeps going and the CO is continuously generated, resulting in sharp changes in carbon content and crystal parameters of the crystals, which fluctuate more than 8%, making it difficult to control the final resistivity and mobility of the product.

The specific examples are only used to illustrate the present application and not used to limit the protection scope of the present application. After reading the specification, those skilled in the art can make modifications to present application without creative contribution as needed, However, it is protected by the patent law as long as it is within the scope of the claims in the present application.

Listing of reference signs:
1. VGF single crystal furnace
2. Quartz crucible
3. Quartz cap
31. Receiving groove
32. Transition tube
33. Graphite
4. PBN crucible
41. Crystal seed
42. GaAs polycrystals
43. Boron oxide
5. First temperature zone
6. Second temperature zone

What is claimed is:

1. A preparation method of a semi-insulating gallium arsenide single crystal, comprising the follow steps:
Step 1: adding GaAs polycrystals, a crystal seed and boron oxide to a pyrolytic boron nitride (PBN) crucible, and transferring the PBN crucible to a quartz crucible; and adding graphite to a quartz cap, and connecting the quartz cap to the quartz crucible hermetically;
Step 2: loading the hermetically connected quartz cap and quartz crucible in Step 1 into a vertical gradient freeze (VGF) single crystal furnace, wherein the quartz cap and the quartz crucible are located in different temperature zones within the VGF single crystal furnace;
Step 3: controlling a temperature in a temperature zone in which the quartz crucible is located at 1238° C. for material melting, while controlling a temperature in a temperature zone in which the quartz cap is located at 1000±50° C.:
Step 4: after the temperature zone in which the quartz crucible is located reaches the temperature of 1238° C. for material melting, preserving the temperature at 1238° C. for the material melting, controlling the temperature in the temperature zone in which the quartz cap is located at 1200±50° C. and preserving the temperature at 1200±50° C. for 4 to 50 h to produce CO for atmosphere doping;
Step 5: after the material melting is completed, lowering a temperature in the temperature zone in which the quartz cap is located to 1000±50° C. and preserving the temperature at 1000±50° C. to allow atmosphere doping and crystal growth to obtain the semi-insulating gallium arsenide single crystal; and
Step 6: cooling and discharging the semi-insulating gallium arsenide single crystal.

2. The preparation method of the semi-insulating gallium arsenide single crystal according to claim 1, wherein the graphite is pre-treated before placing in the quartz cap, and the pre-treating comprises removal of moisture.

3. The preparation method of the semi-insulating gallium arsenide single crystal according to claim 2, wherein the PBN crucible, the quartz crucible, the quartz cap and the VGF single crystal furnace are subjected to the pre-treating before using.

4. The preparation method of the semi-insulating gallium arsenide single crystal according to claim 2, wherein the pre-treating comprises vacuuming, and the vacuuming is performed at an absolute vacuum degree of ($1$ to $9\times10^{4}$) to ($1$ to $9\times10^{-2}$) Pa.

5. The preparation method of the semi-insulating gallium arsenide single crystal according to claim 1, wherein the crystal growth is performed at a cooling rate of 0.1 to 10° C./h and a temperature gradient of 0.1 to 10° C./cm in Step 5.

\* \* \* \* \*